United States Patent
Sinkunas et al.

(10) Patent No.: US 6,833,526 B2
(45) Date of Patent: Dec. 21, 2004

(54) FLEX TO FLEX SOLDERING BY DIODE LASER

(75) Inventors: Peter J. Sinkunas, Canton, MI (US); Zhong-You Shi, Ann Arbor, MI (US); Lawrence L. Bullock, deceased, late of Detroit, MI (US); by Jason Bullock, legal representative, Detroit, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 68 days.

(21) Appl. No.: 09/820,092

(22) Filed: Mar. 28, 2001

(65) Prior Publication Data

US 2003/0019846 A1 Jan. 30, 2003

(Under 37 CFR 1.47)

(51) Int. Cl.$^7$ .................... B23K 26/00; B23K 26/08; B23K 31/00; B23K 31/02
(52) U.S. Cl. .................... 219/121.66; 219/121.78; 219/121.8; 228/179.1; 228/188; 228/190
(58) Field of Search .................... 219/121.6, 121.65, 219/121.66, 121.78, 121.79, 121.8, 121.85; 228/179.1, 188, 190, 207, 245.1, 245

(56) References Cited

U.S. PATENT DOCUMENTS

| 4,404,453 A | * | 9/1983 | Gotman | 219/121.64 |
| 4,531,044 A | * | 7/1985 | Chang | 219/121.85 |
| 4,547,652 A | | 10/1985 | Raisig et al. | |
| 4,562,637 A | | 1/1986 | Kushima et al. | |
| 4,682,001 A | * | 7/1987 | Locke | 219/121.63 |
| 4,700,044 A | * | 10/1987 | Hokanson et al. | 219/121.63 |
| 4,799,755 A | * | 1/1989 | Jones | 385/38 |
| 4,806,728 A | * | 2/1989 | Salzer et al. | 219/121.63 |
| 4,914,269 A | * | 4/1990 | Kinsman et al. | 219/121.64 |
| 5,021,630 A | * | 6/1991 | Benko et al. | 219/121.64 |
| 5,083,007 A | | 1/1992 | Spletter et al. | 219/121.64 |
| 5,122,635 A | * | 6/1992 | Knodler et al. | 219/121.63 |
| 5,194,710 A | | 3/1993 | McDaniel et al. | 219/121.63 |

(List continued on next page.)

FOREIGN PATENT DOCUMENTS

| EP | 0901187 A2 | 3/1999 |
| EP | 0964608 A2 | 12/1999 |
| JP | 04137795 | 5/1992 |
| WO | WO 9918762 | 4/1999 |

OTHER PUBLICATIONS

European Search Report issued by the European Patent Office for European application No. 02252109.0, Sep. 30, 2002, pp. 1–4.

*Primary Examiner*—Colleen P. Cooke
(74) *Attorney, Agent, or Firm*—Brinks Hofer Gilson & Lione

(57) ABSTRACT

A method to solder flex circuits by diode laser. First and second flex circuits composed of polymer flex substrate are provided. Each flex circuit has a top and a bottom side and at least one contact trace embedded in its surface. An area of solder is provided on the contact trace of at least one of the flex circuits and the flex circuits are positioned so that the contact traces of each flex circuit are substantially aligned. A laser beam is positioned to heat the contact trace to melt the solder and fuse the contacts.

39 Claims, 5 Drawing Sheets

U.S. PATENT DOCUMENTS

| | | | |
|---|---|---|---|
| 5,239,156 A | | 8/1993 | Jones et al. |
| 5,565,119 A | * | 10/1996 | Behun et al. .......... 219/121.63 |
| 5,852,257 A | * | 12/1998 | Dittman et al. ................ 174/59 |
| 5,920,462 A | * | 7/1999 | Glovatsky et al. .......... 361/760 |
| 6,100,178 A | * | 8/2000 | Todd et al. ................. 438/622 |
| 6,168,070 B1 | * | 1/2001 | Sinkunas ................ 228/179.1 |
| 6,200,142 B1 | | 3/2001 | Soh .............................. 439/67 |
| 6,212,046 B1 | * | 4/2001 | Albrecht et al. ......... 360/264.2 |
| 6,284,998 B1 | * | 9/2001 | Sinkunas et al. ...... 219/121.64 |
| 6,319,751 B1 | * | 11/2001 | Lin ............................. 438/108 |
| 6,333,483 B1 | * | 12/2001 | Ueno .................... 219/121.64 |
| 6,369,345 B1 | * | 4/2002 | Zaloga et al. ............ 219/85.13 |
| 6,380,513 B1 | * | 4/2002 | Remy De Graffenried ............ 219/121.85 |
| 6,392,291 B1 | * | 5/2002 | Corisis ....................... 257/678 |
| 6,513,701 B2 | * | 2/2003 | Mead et al. ............. 228/248.1 |
| 6,528,891 B2 | * | 3/2003 | Lin ............................. 257/778 |
| 6,537,850 B1 | * | 3/2003 | Corisis ....................... 438/106 |

* cited by examiner

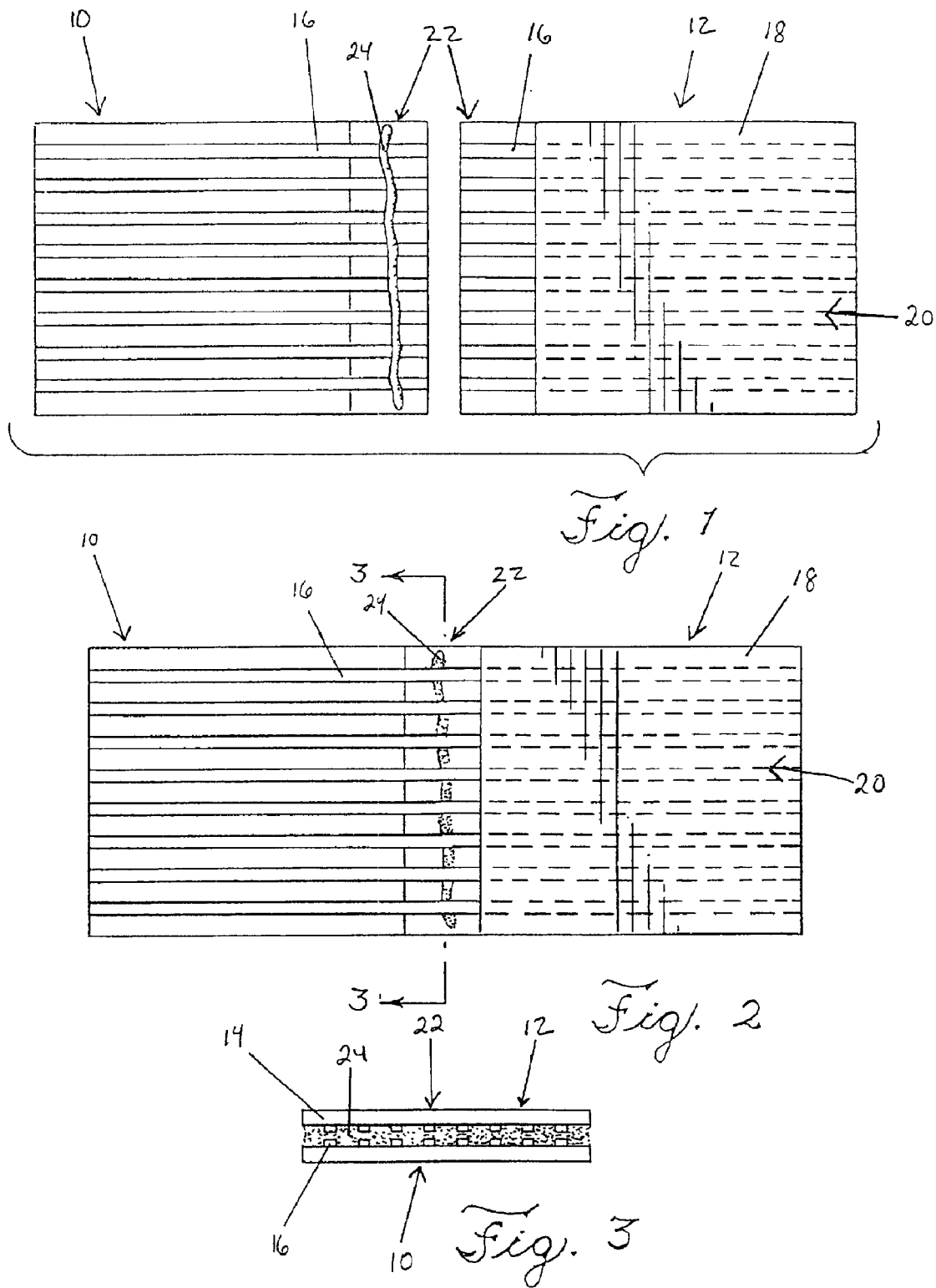

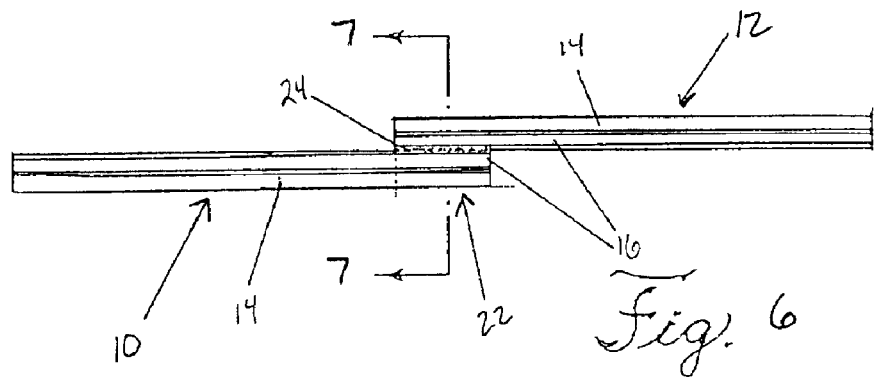
Fig. 6
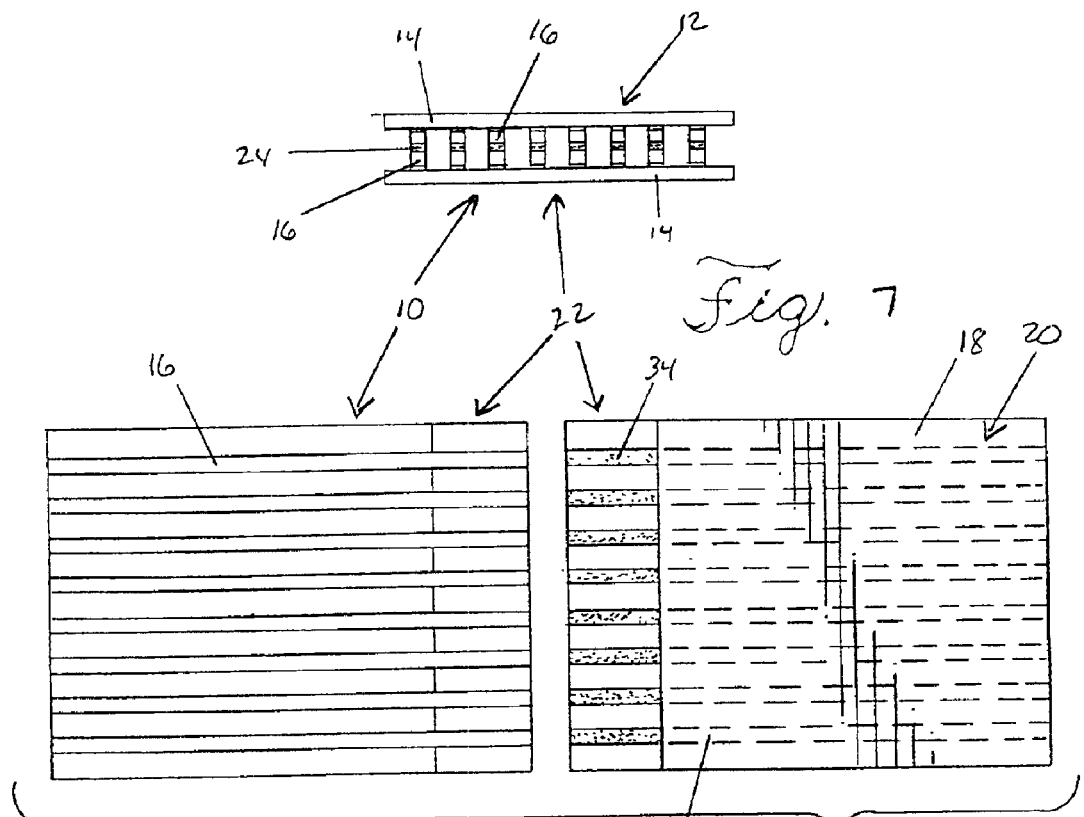
Fig. 7
Fig. 8
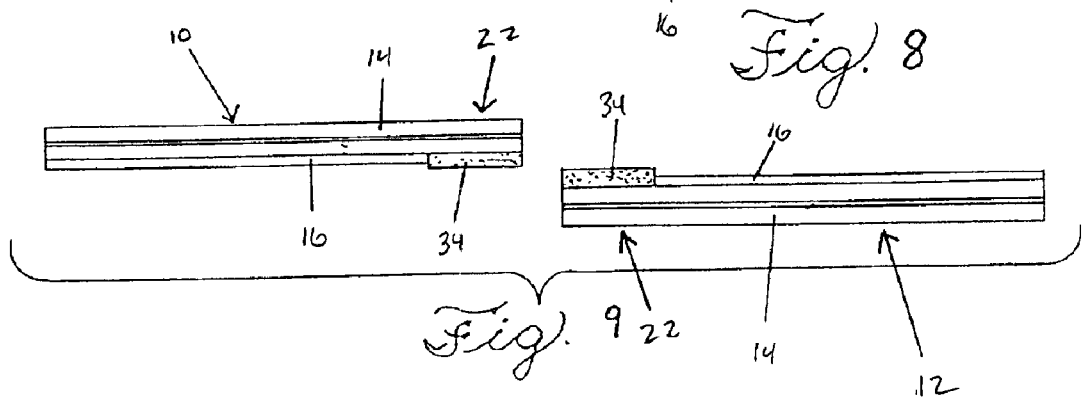
Fig. 9

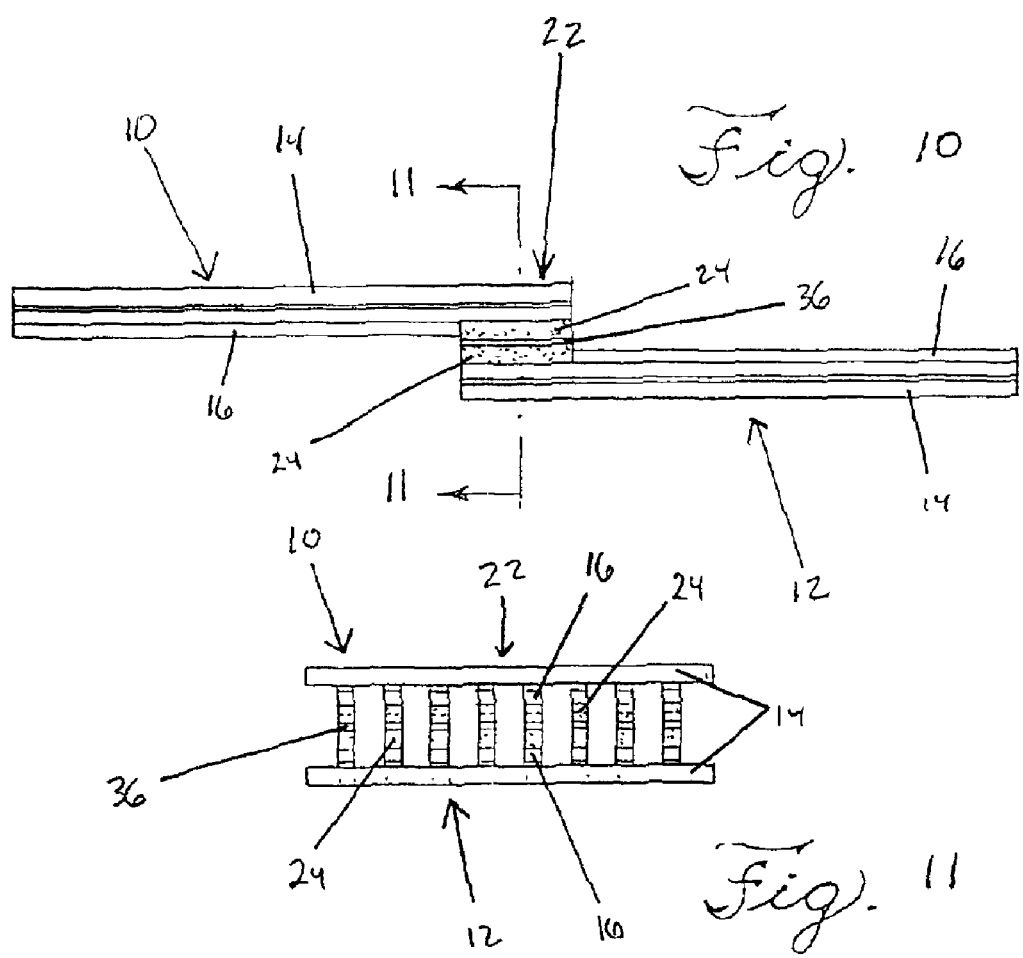

FLEX TO FLEX SOLDERING BY DIODE LASER

FIELD OF THE INVENTION

The invention relates generally to the field of soldering methods. In particular, this invention relates to a method for soldering flexible circuit boards with a laser.

DESCRIPTION OF THE RELATED ART

In order to increase the reliability, reduce the number of cable harnesses, and reduce manufacturing costs, many car manufacturers are replacing round wires with flat-wire plastic flex circuits. These plastic flex circuits are normally constructed from flexible plastic with flat wires embedded in or laminated to the surface.

Plastic flex circuits provide many advantages over traditional round wire harness connections. They are less complex than their round wire counterparts, they have better thermal dissipation because of their larger surface area, and they are cheaper and easier to construct. Flex circuits also have the advantage of being able to act as signal and power carrying means as well as actually becoming part of the circuits themselves.

In practice, different flex circuits and busses may have to be soldered together so that one main flex bus may have several branch flexes and takeouts. This allows the designer to manipulate the placement and shape of each individual flex circuit. To attain these connections between different flex circuits, the preferred method is to solder them together using a conventional reflow solder method. In this method, a layer of solder paste comprised of solder balls in a petroleum jelly-like flux is sandwiched between the copper conductors of two separate flex circuit pieces. The flex pieces are then fed into a reflow oven that heats the pieces, melting the solder paste, which then hardens and binds the copper conductors together. However, since the reflow peak temperature is usually as high as 210° C., this method only works well if the flex is made of high glass-transition temperature (Tg) polymers such as polyamide or nylon. If lower Tg flexes are utilized, they will be severely deformed by the high temperatures of the reflow oven, and will lose their functionality.

Unfortunately, high Tg flex material is much more expensive than low Tg flex material. A low Tg flex material such as PET, which has a Tg of only 80° C., can perform the desired functions of high Tg flex material at a much lower cost. These PET flex materials can resist the thermal conditions where they are normally housed, such as the instrument panel of an automobile, but they cannot survive the soldering process. It is desirable to solder low Tg flex circuits without deforming them so that the cost of these circuits can be reduced.

Laser soldering has been tried in the past in soldering processes. One method utilizes a stationary laser with 18-inch optics to solder many copper traces together simultaneously. However, because of the size of this laser, the power is much lower than a small, focused laser. In order to reflow solder paste in a typical application, a laser of this size and of reasonable power may require up to 30 seconds or more of application time. This is extremely inefficient and can result in damage to the plastic flex circuits since the copper traces remain heated for an extended period of time.

BRIEF SUMMARY OF THE INVENTION

In one embodiment of the present method, first and second flex circuits composed of polymer flex substrate are provided. Each flex circuit has a top and a bottom side and at least one contact trace embedded in its surface. An area of solder is provided on the contact trace of at least one of the flex circuits and the flex circuits are positioned so that the contact traces of each flex circuit are substantially aligned. A laser beam is positioned to heat the contact trace to melt the solder and fuse the contacts.

In another embodiment of the present method, first and second flex circuits formed from polymer flex substrate and having top and bottom sides are provided. At least one contact trace is embedded in each flex circuit and a layer of solder is plated onto the contact traces. The flex circuits are positioned so that the contact traces are in substantial alignment and a laser beam is positioned at a point relative to the flex circuits. The laser beam is then moved from the point across the flex circuits over the contact traces to reflow the solder and fuse the traces.

In yet another embodiment of the present method, plastic substrates with top and bottom sides are provided and contact traces are laminated to each substrate. The substrates are positioned such that the contact traces form an alignment area and a layer of solder is applied to at least one of the contact traces. A laser is positioned at a point relative to the substrates and the laser is moved across the substrates so that the beam heats a portion of the contact trace to reflow the solder and fuse the traces.

BRIEF DESCRIPTION OF SEVERAL VIEWS OF THE DRAWINGS

FIG. 1 is a view of two flex pieces of an embodiment of the invention with a line of solder paste in place before soldering;

FIG. 2 is a view of the two flex pieces of FIG. 1 in contact with each other before application of the laser;

FIG. 3 is a cross-section along line 3—3 of FIG. 2;

FIG. 6 is a side view of an embodiment of the invention after soldering;

FIG. 7 is a cross-section along line 7—7 of FIG. 6;

FIG. 8 is a view of an alternate embodiment of the invention showing solder plated onto the copper traces;

FIG. 9 is a side view of the embodiment of FIG. 8;

FIG. 10 is a side view of the embodiment of FIG. 8 with the flex pieces in contact before soldering;

FIG. 11 is a cross-section along line 11—11 of FIG. 10;

DETAILED DESCRIPTION OF THE PREFERRED EMBODIMENTS OF THE INVENTION

Figure 4:
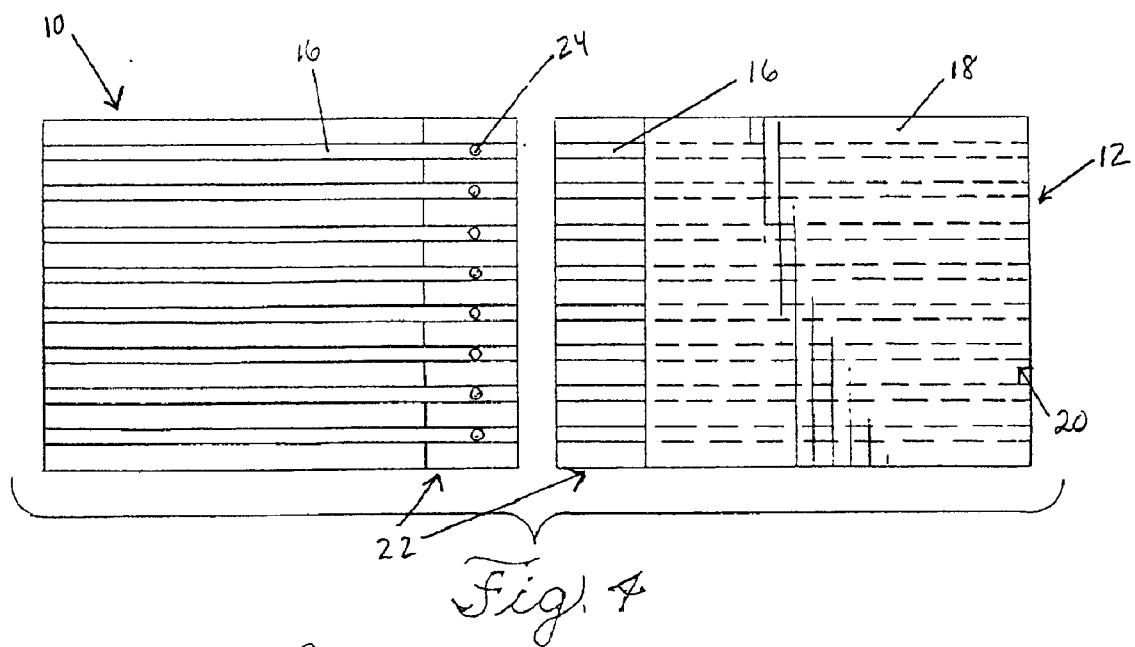
FIG. 4 is a view of two flex pieces of an alternate embodiment of the invention showing solder paste only on the copper traces.

Referring in conjunction to FIGS. 1–3, in one embodiment of the present invention, the method includes the step of providing a first 10 and a second 12 plastic flex circuit. The flex circuits 10, 12 are preferably comprised of a low glass transition temperature (Tg) material such as PET substrate 14. The PET substrate 14 preferably has very little absorption of near-infrared radiation. This characteristic of the PET substrate 14 allows it to act transparent to near-infrared radiation. Thus, when this type of radiation comes in contact with the PET substrate 14, the radiation passes though the PET substrate 14 without increasing the vibrational energies of the PET substrate 14 and causing the substrate 14 to increase in temperature.

As shown in FIG. 1, the first flex circuit 10 is the top flex circuit and the second flex circuit 12 is the bottom flex circuit. Each flex circuit 10, 12 preferably has at least one exposed contact trace 16 in place on its surface. The contact traces 16 are preferably formed from copper. The copper traces 16 may be laminated to the flex circuits 10, 12 or embedded in the flex circuits 10, 12. An adhesive could also be used to connect the copper traces 16 to the flex circuits 10, 12. A solder mask 18 is preferably in place in a layer over a section 20 of the copper traces 16 on the flex circuits 10, 12. In the Figures, the solder mask 18 is shown on the top side of the second flex circuit 12. The solder mask 18 is preferably in place on the bottom side of the first flex circuit 10. The solder mask 18 is preferably an epoxy or acrylic-like material and prevents air and moisture from contacting the copper traces 16, preventing them from becoming oxidized. The section 22 of the copper traces 16 that is not coated with solder mask 18 is the alignment area 22 where the two flex circuits 10 and 12 contact each other.

The preferred embodiment of the method includes the step of applying a continuous bead of solder paste 24 to either the copper traces 16 of the first 10 or the second 12 flex circuits near the alignment area 22. It is not necessary to carefully apply the solder paste 24 to only the copper traces 16, but in another embodiment of the method, shown in FIG. 4, the solder paste 24 is applied only in defined areas of the individual copper traces 16 of the first flex circuit 10. The solder paste 24 could also be applied to the copper traces 16 of the second flex circuit 12. Preferably, after application of the solder paste, the alignment areas 22 of the first 10 and the second 12 flex circuits are aligned such that the copper traces 16 of the first 10 and the second 12 flex circuits are in substantial alignment and the exposed copper traces 16 face each other. In the preferred embodiment of the method, pressure is applied to the flex circuits 10, 12 such that the solder paste 24 is sandwiched between the copper traces 16 of the flex circuits 10, 12. FIG. 2 shows the flex circuits 10, 12 in their preferable alignment before soldering and FIG. 3 shows a side view of the solder paste 24 in place between the copper traces 16. In the embodiment shown, before soldering, the solder paste 24 fills the entire space between the alignment area 22 of the flex circuits as shown in FIG. 3.

Figure 5:
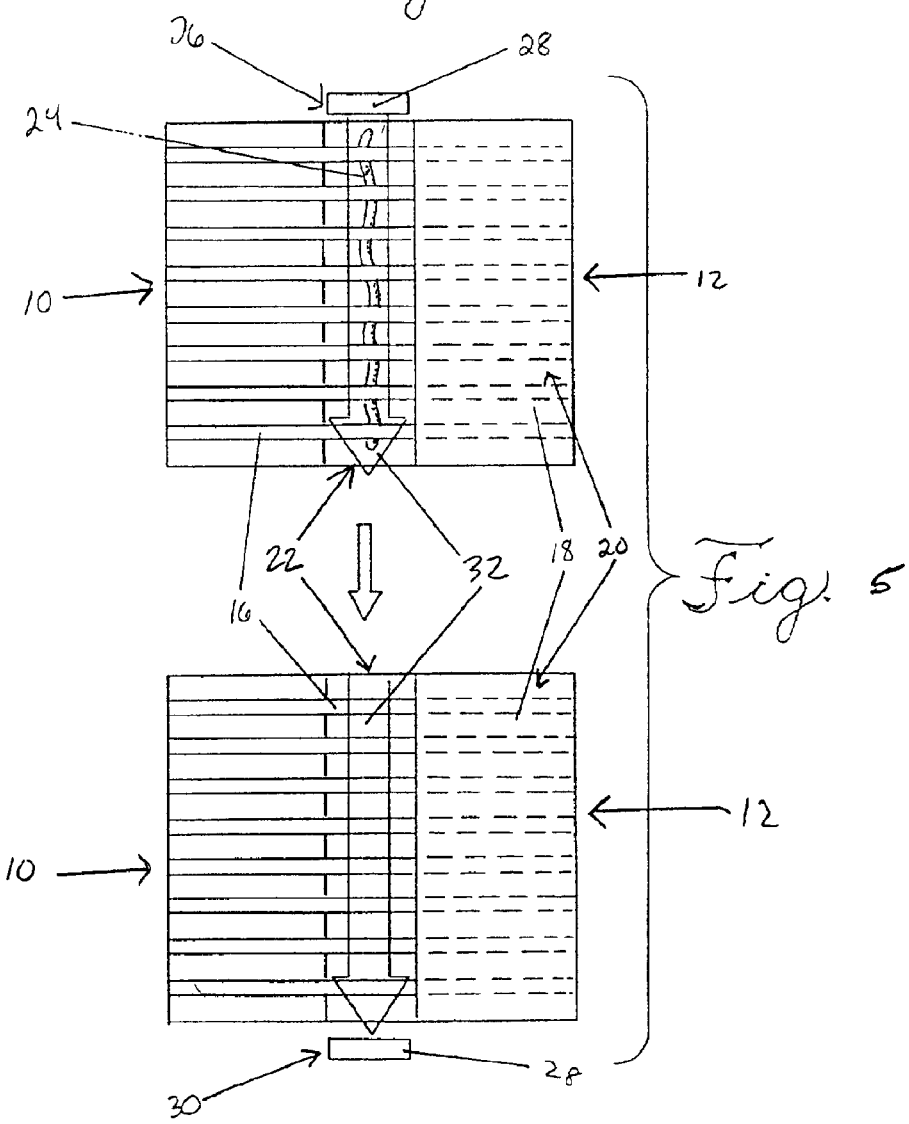
FIG. 5 is a view of the embodiment of FIG. 1 showing the path of the laser during the soldering process.

Referring to FIG. 5, the preferred embodiment of the method includes the step of positioning a diode laser (not shown) approximately near the infrared spectrum at a first position 26. In FIG. 5, the spot 28 of the laser beam is shown for clarity. The laser spot 28 is preferably rectangular and is aligned such that the copper traces 16 are within the focal point of the laser spot 28. In a preferred embodiment of the method, the rectangular laser spot 28 is positioned such that it is parallel to the copper traces 16. The next preferred step of the method is to move the laser spot 28 from the first position 26 across the alignment area 22 to a second position 30. An arrow 32 shows the progression of the laser spot 28 across the alignment area 22. As the laser spot 28 moves across the alignment area 22 it heats each copper trace 16 and continues to move such that it ceases to heat each copper trace 16. Preferably, the laser spot 28 heats each copper trace 16 for less than one second. Since the PET substrate 14 does not absorb the near infrared light of the laser spot 28, the spot 28 passes through the PET substrate 14 and contacts the copper trace 16. The copper trace 16 preferably absorbs the energy from the laser spot 28 and heats up quickly, reflowing the solder paste 24 in contact with the copper trace 16. When the laser spot 28 passes out of contact with the copper trace 16, the copper trace 16 cools down and the solder paste 24 hardens, fusing the copper traces 16 of the first 10 flex circuit and the second 12 flex circuit. The laser spot 28 preferably moves at a constant speed through all of the copper traces 16.

After the preferred method is applied to the flex circuits 10, 12, the copper traces 16 of the flexes 10, 12 are fused together. When the laser spot 28 heats the copper traces 16 and melts or reflows the solder paste 24, the surface tension of the solder paste 24 causes it to be drawn to the copper traces 16 and prevents the solder paste 24 from bridging between adjacent copper traces 16. FIG. 6 shows a side view of the flex circuits 10, 12 after the solder paste 24 rehardens and FIG. 7 shows a cross-section view of the flex circuits 10, 12 after soldering.

An alternate embodiment of the method is shown in FIGS. 8–11. In this alternate embodiment, the solder 34 is preferably plated directly onto the copper traces 16. It is also possible to place solder preforms on the surface of the traces 16. It is not necessary to apply a line of solder paste as in the embodiment shown in FIG. 1 and described previously. In this embodiment, there are once again two flex circuits 10, 12 with copper traces 16 attached to their surfaces. A solder mask layer 18 is preferably applied in the same manner as in the first embodiment and performs the same protective function. FIGS. 8 and 9 show the solder 34 plated on the copper traces 16 and the flex circuits 10, 12 out of contact with each other. The Figures show the solder 34 plated on the copper traces 16 of both the first 10 and second 12 flex circuits, but it is possible to perform the method by plating the solder only on the copper traces 16 of one of the flex circuits 10, 12.

Preferably, a layer of flux 36 is applied on top of the solder 34. This flux 36 acts as an insulator before soldering. The flux 36 is preferably rosin or resin-based, contains an acid and is high in organic solids. This composition allows the flux 36 to clean the copper traces 16 during the soldering process. Preferably, after application of the flux 36 to the plated-on solder 34, the flex circuits 10, 12 are aligned such that the copper traces 16 are in alignment with each other, forming the alignment area 22. FIG. 10 shows a side view of the flex circuits 10, 12 aligned and in contact with each other and the flux 36 in position between the solder 34 plated on the copper traces 16. FIG. 11 shows a cross-sectional view of the same arrangement. It is also possible to perform the method of the invention without using the layer of flux 36, although the solder joint formed will not be as strong as a joint formed using a layer of flux 36.

This embodiment of the method further includes the step of aligning a diode laser such that the spot 28 is aligned as previously described. The spot 28 moves in the same manner as the embodiment previously described and depicted in FIG. 5. The energy from the spot 28 heats the copper traces 16 which in turn reflows the plated solder 34. The plated solder 34 mixes with the flux 36 and hardens after the spot 28 passes out of contact with the copper traces 16. FIGS. 6 and 7 show the completed solder joint.

Figure 12:
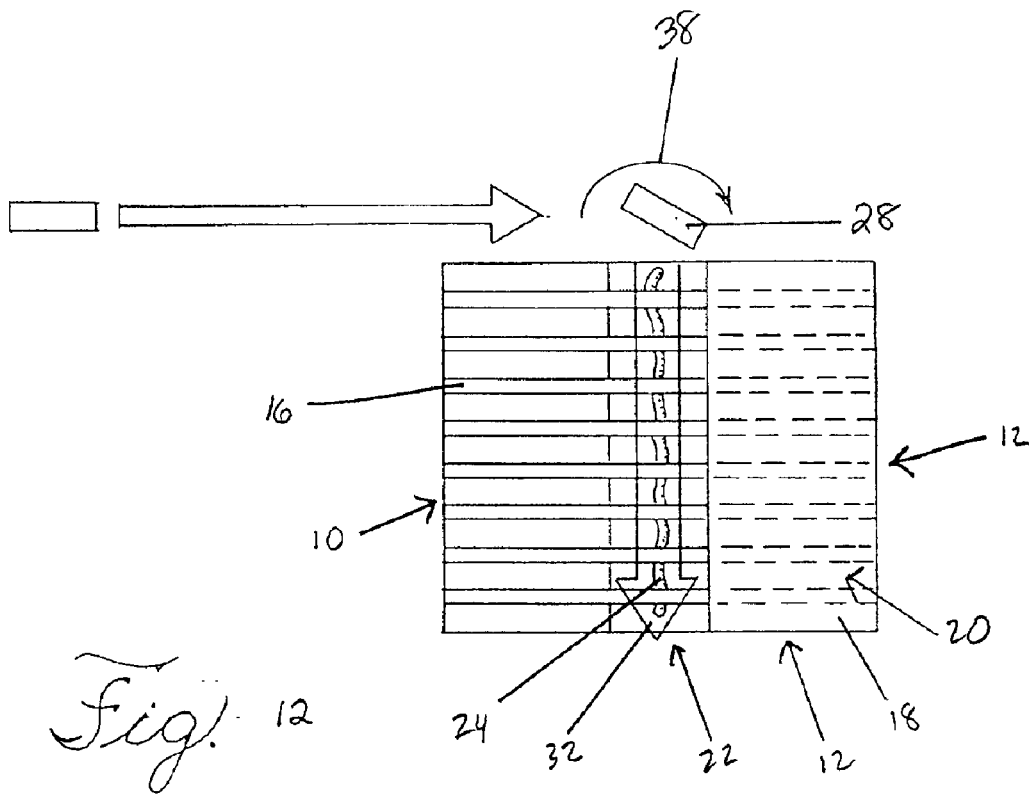
FIG. 12 is a view of an alternate embodiment of the invention showing the laser in an angled position.

In yet another embodiment of the invention, the laser spot 28 is adjusted relative to the copper traces 16. In this embodiment, either the plated solder 34 or the solder paste 24 may be used. FIG. 12 shows this embodiment utilizing the line of solder paste 24 as in FIG. 1. In this embodiment, the laser spot 28 is angled relative to the copper traces 16 before it is passed over the traces 16. An arrow 38 shows the direction of the adjustment to the laser spot 28, but it could be adjusted in any direction. By angling the laser spot 28 in this manner, the spot 28 can contact more than one copper trace 16 at a time during its progression across the alignment area 22. This results in an increase in efficiency. Another advantage to angling the laser spot 28 is that it allows the use of this method to solder copper traces 16 with extremely thin widths between 1.0 mm and 0.4 mm.

Figure 13:
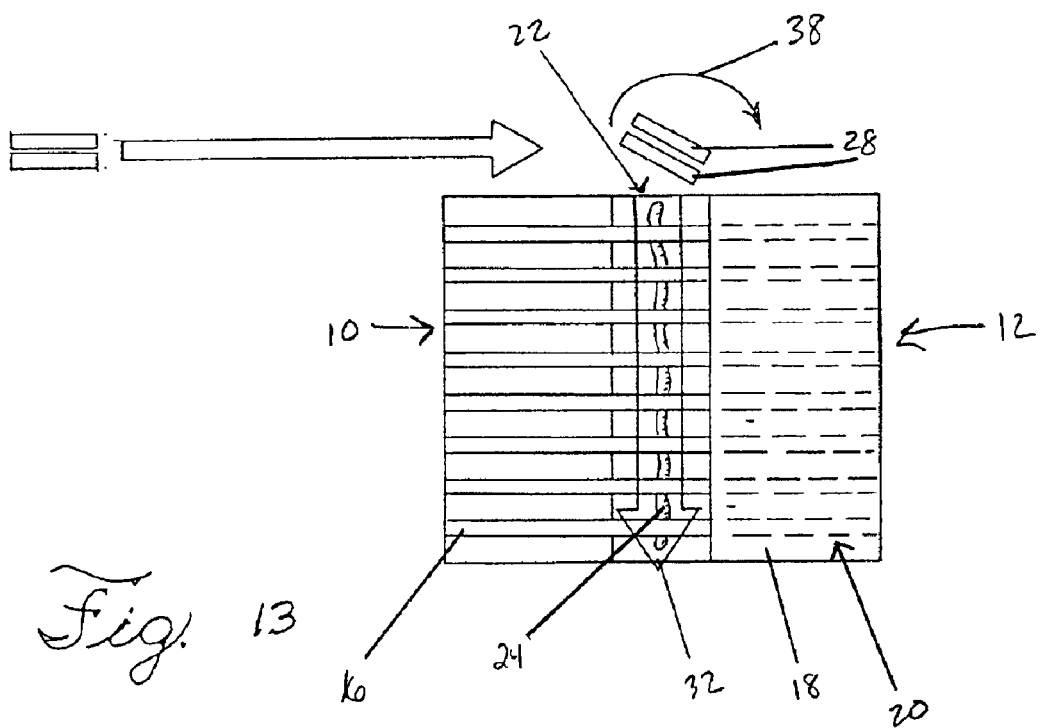
FIG. 13 is a view of an alternate embodiment of the invention utilizing two angled lasers.

In another embodiment of the invention shown in FIG. 13, more than one diode laser is utilized, resulting in two or more laser spots 28. These spots 28 may be aligned horizontally or angled as previously described. The use of more than one diode laser gives more control over the speed and control of the soldering process. By angling the laser spot 28 or utilizing more than one laser spot 28, the method reduces the problem of solder balling and solder bridging over to the adjacent copper trace 16. In all embodiments, this method provides an efficient way to solder flex circuits together without damaging them. Low Tg plastic may be used in this method, and this reduces the cost of the circuits. The method is also rapid and allows the soldering of many copper traces and flex pieces at a time.

It should be noted that there could be a wide range of changes made to the present invention without departing from its scope. Different materials could be used for the plastic substrate of the flex circuits. High Tg materials could be used as well. Any number of diode lasers could be utilized, and the lasers could travel in any direction across the alignment area 22. It is also possible to perform the method without the solder mask 18 in place if desired. Since the laser beam enters the soldering area from one side of the flex circuits, only one plastic substrate needs to be transparent to the infrared beam. The opposite side can be formed from material such as FR-4 circuit boards or ceramic boards, and does not need to allow the infrared beam to pass through it. Conductive materials other than copper could be utilized for the traces 16. Thus, it is intended that the foregoing detailed description be regarded as illustrative rather than limiting and that it be understood that it is the following claims, including all equivalents, which are intended to define the scope of the invention.

What is claimed is:

1. A method for soldering plastic flex circuits by diode laser, said method comprising the steps of:
   providing at least a first flex circuit and a second flex circuit composed of polymer flex substrate, each having a top and bottom side, and each with at least one contact trace laminated thereon;
   providing an area of solder on said at least one contact trace of at least one of said first flex circuit or said second flex circuit;
   positioning said first flex circuit and said second flex circuit such that said at least one contact trace of each flex circuit are in substantial alignment;
   positioning at least one laser beam to heat said at least one contact trace to melt said solder and fuse said contacts; and
   moving said laser beam across said flex circuits.

2. The method of claim 1, wherein said contact traces are copper traces.

3. The method of claim 2, wherein said solder is in the form of a solder paste.

4. The method of claim 3, wherein said laser beam is a diode laser approximately near the infrared spectrum.

5. The method of claim 4, wherein said laser beam has a substantially rectangular shape.

6. The method of claim 5, wherein said polymer flex substrate of at least one of said first and said second flex circuits is substantially transparent to light near the infrared spectrum.

7. The method of claim 6, further comprising a solder mask covering a portion of said at least one copper trace on said bottom side of said first flex circuit and covering a portion of said at least one copper trace on said top side of said second flex circuit.

8. The method of claim 1, wherein said are of solder paste is not covered by solder mask.

9. The method of claim 8, wherein said beam heats said at least one copper trace at a point within said focal point of said beam.

10. The method of claim 9, wherein said copper traces are heated by said beam causing said solder paste to reflow.

11. The method of claim 10, wherein said copper trace of said first flex circuit and said copper trace of said second flex circuit are fused together by said solder after reflow.

12. The method of claim 10, wherein said beam remains parallel to said at least one copper trace.

13. The method of claim 10, wherein said beam is angled in relation to said at least one copper trace.

14. The method of claim 10, wherein at least two beams arranged parallel to each other are utilized.

15. A method for soldering plastic flex circuits by using a laser, said method comprising the steps of:
   providing at least a first flex circuit and a second flex circuit composed of polymer flex substrate, each having a top and a bottom side, and each with at least one contact trace laminated thereon;
   providing a layer of solder on said at least one contact trace of at least one of said first or said second flex circuits;
   positioning said first flex circuit and said second flex circuit such that said at least one contact trace of each flex circuit are in substantial alignment;
   positioning at least one laser beam at a point relative to said first flex circuit and said second flex circuit; and
   moving said at least one laser beam from said point across said flex circuits over said contact traces to cause said solder to reflow and fuse said contact traces.

16. The method of claim 15, wherein said layer of solder is in the form of a preform placed on said contact trace.

17. The method of claim 15, wherein said layer of solder is plated onto said contact trace.

18. The method of claim 17, wherein a layer of flux is applied on said layer of solder plated on said at least one contact trace.

19. A method for soldering plastic flex circuits, said method comprising the steps of:
   providing a first plastic substrate and a second plastic substrate, each with a top side and a bottom side;
   laminating at least one first contact trace to said bottom side of said first plastic substrate;
   laminating at least one second contact trace to said top side of said second plastic substrate;
   aligning said first plastic substrate and said second plastic substrate such that said at least one first contact trace and said at least one second contact trace are substantially aligned and form an alignment area;
   applying a layer of solder to said at least one first contact trace within said alignment area;

positioning at least one laser at a point relative to said first plastic substrate and said second plastic substrate; and moving said at least one laser from said point across said first plastic substrate and said second plastic substrate such that the beam of said laser heats at least a portion of said at least one first contact trace to cause said solder to reflow and fuse said contact traces.

20. The method of claim 19, wherein said beam continues to move after heating said at least one first contact trace.

21. The method of claim 20, wherein said beam of said diode laser has a substantially rectangular shape.

22. A method for soldering plastic flex circuits by diode laser, said method comprising the steps of:

providing at least a first flex circuit and a second flex circuit composed of polymer flex substrate, each having a top and bottom side, and each with at least one contact trace laminated thereon;

providing an area of solder on said at least one contact trace of at least one of said first flex circuit or said second flex circuit;

positioning said first flex circuit and said second flex circuit such that said at least one contact trace of each flex circuit are in substantial alignment;

positioning at least one laser beam to heat said at least one contact trace to melt said solder and fuse said contacts; and moving said laser beam across said flex circuits at a constant speed.

23. The method of claim 22, wherein said contact traces are copper traces.

24. The method of claim 23, wherein said solder is in the form of a solder paste.

25. The method of claim 24, wherein said laser beam is a diode laser approximately near the infrared spectrum.

26. The method of claim 25, wherein said laser beam has a substantially rectangular shape.

27. The method of claim 26, wherein said polymer flex substrate of at least one of said first and said second flex circuits is substantially transparent to tight near the infrared spectrum.

28. The method of claim 27, further comprising a solder mask covering a portion of said at least one copper trace on said bottom side of said first flex circuit and covering a portion of said at least one copper trace on said top side of said second flex circuit.

29. The method of claim 28, wherein said area of solder paste is not covered by solder mask.

30. The method of claim 29, wherein said beam heats said at least one copper trace at a point within said focal point of said beam.

31. The method of claim 30, wherein said copper traces are heated by said beam causing said solder paste to reflow.

32. The method of claim 31, wherein said copper trace of said first flex circuit and said copper trace of said second flex circuit are fused together by said solder after reflow.

33. The method of claim 31, wherein said beam remains parallel to said at least one copper trace.

34. The method of claim 31, wherein said beam is angled in relation to said at least one copper trace.

35. The method of claim 31, wherein at least two beams arranged parallel to each other are utilized.

36. A method for soldering plastic flex circuits by using a laser, said method comprising the steps of:

providing at least a first flex circuit and a second flex circuit composed of polymer flex substrate, each having a top and a bottom side, and each with at least one contact trace laminated thereon;

providing a layer of solder on said at least one contact trace of at least one of said first or said second flex circuits;

positioning said first flex circuit and said second flex circuit such that said at least one contact trace of each flex circuit are in substantial alignment;

positioning at least one laser beam at a point relative to said first flex circuit and said second flex circuit; and moving said at least one laser beam from said point across said flex circuits over said contact traces at a constant speed to cause said solder to reflow and fuse said contact traces.

37. The method of claim 36, wherein said layer of solder is in the form of a preform placed on said contact trace.

38. The method of claim 36, wherein said layer of solder is plated onto said contact trace.

39. The method of claim 38, wherein a layer of flux is applied on said layer of solder plated on said at least one contact trace.

* * * * *

UNITED STATES PATENT AND TRADEMARK OFFICE
CERTIFICATE OF CORRECTION

PATENT NO. : 6,833,526 B2
DATED : December 21, 2004
INVENTOR(S) : Peter J. Sinkunas et al.

It is certified that error appears in the above-identified patent and that said Letters Patent is hereby corrected as shown below:

<u>Column 7,</u>
Line 40, after "transparent to" delete "tight" and substitute -- light -- in its place.

Signed and Sealed this

Thirty-first Day of May, 2005

JON W. DUDAS
*Director of the United States Patent and Trademark Office*